United States Patent
Akao et al.

(10) Patent No.: US 8,557,720 B2
(45) Date of Patent: Oct. 15, 2013

(54) SUBSTRATE PROCESSING APPARATUS AND METHOD OF MANUFACTURING A SEMICONDUCTOR DEVICE

(75) Inventors: Tokunobu Akao, Toyama (JP); Unryu Ogawa, Toyama (JP); Masahisa Okuno, Toyama (JP); Shinji Yashima, Toyama (JP); Atsushi Umekawa, Toyama (JP); Kaichiro Minami, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 33 days.

(21) Appl. No.: 13/242,690

(22) Filed: Sep. 23, 2011

(65) Prior Publication Data

US 2012/0108061 A1    May 3, 2012

(30) Foreign Application Priority Data

Oct. 28, 2010 (JP) .................. 2010-241884
Jun. 29, 2011 (JP) .................. 2011-143718

(51) Int. Cl.
*H01L 21/324* (2006.01)
*H01L 21/42* (2006.01)
*H01L 21/44* (2006.01)

(52) U.S. Cl.
USPC ......................... 438/795; 438/680

(58) Field of Classification Search
USPC .................................. 438/680, 795
See application file for complete search history.

(56) References Cited

U.S. PATENT DOCUMENTS

| | | | |
|---|---|---|---|
| 5,342,472 A | 8/1994 | Imahashi et al. | |
| 5,545,258 A * | 8/1996 | Katayama et al. | 118/723 MP |
| 5,874,706 A * | 2/1999 | Ishii et al. | 219/121.43 |
| 6,514,073 B1 * | 2/2003 | Toshima et al. | 432/85 |
| 6,797,111 B2 * | 9/2004 | Hongoh et al. | 156/345.41 |
| 2004/0238123 A1 * | 12/2004 | Becknell et al. | 156/345.33 |
| 2007/0224839 A1 | 9/2007 | Shimizu | |
| 2012/0129358 A1 * | 5/2012 | Ogawa et al. | 438/795 |

FOREIGN PATENT DOCUMENTS

| | | |
|---|---|---|
| JP | 63-076336 A | 4/1988 |
| JP | 2002-530883 A | 9/2002 |
| JP | 2002-289521 A | 10/2002 |
| JP | 2004296820 | 10/2004 |
| JP | 2007-258286 A | 10/2007 |
| KR | 10-1993-0005132 A | 3/1993 |
| KR | 10-0156011 B1 | 12/1998 |
| KR | 10-2003-0045945 A | 6/2003 |
| WO | 00/31777 A1 | 6/2000 |

* cited by examiner

*Primary Examiner* — Luan C Thai
(74) *Attorney, Agent, or Firm* — Volpe and Koenig, P.C.

(57) ABSTRACT

A substrate processing apparatus includes a processing chamber configured to process a substrate having a front surface including a dielectric, a substrate support member provided within the processing chamber to support the substrate, a microwave supplying unit configured to supply a microwave to a front surface side of the substrate supported on the substrate support member; and a conductive substrate cooling unit which is provided at a rear surface side of the substrate supported on the substrate support member and has an opposing surface facing the rear surface of the substrate. A distance between the top of the substrate support member and the opposing surface of the substrate cooling unit corresponds to an odd multiple of ¼ wavelength of the microwave supplied when the substrate is processed.

12 Claims, 3 Drawing Sheets

SUBSTRATE PROCESSING APPARATUS AND METHOD OF MANUFACTURING A SEMICONDUCTOR DEVICE

CROSS-REFERENCE TO RELATED APPLICATIONS

This application is based upon and claims the benefit of priority from Japanese Patent Application Nos. 2010-241884, filed on Oct. 28, 2010, and 2011-143718, filed on Jun. 29, 2011, the entire contents of which are incorporated herein by reference.

TECHNICAL FIELD

The present disclosure relates to a substrate processing technique for forming semiconductor devices such as integrated circuits (ICs) on a substrate, and more particularly, to a semiconductor manufacturing apparatus which is capable of using a microwave to process a substrate such as a semiconductor wafer (hereinafter referred to as "wafer") or the like, a substrate processing apparatus for processing a substrate, and a method of manufacturing a semiconductor device.

BACKGROUND

There exists a chemical vapor deposition (CVD) process for forming film on a surface of a single substrate (an object substrate having fine patterns of electrical circuits formed thereon with a silicon wafer or glass as a base) in a semiconductor manufacturing process. In the CVD process, a substrate is loaded into an airtight reaction chamber and heated by a heater provided within the reaction chamber to cause a chemical reaction while film forming gas is being introduced onto the substrate, so that film can be uniformly formed on fine patterns of electrical circuits formed on the substrate. According to such a CVD process, for example, organic chemical material may be used as film forming raw material to form a high-k film, such as a HfO film or the like, which is an insulating film having a high dielectric constant.

Since a HfO film formed in this way contains a considerable amount (i.e., several percentages) of impurities such as CH, OH or the like due to the organic chemical material, it has insufficient electrical insulating property. In order to secure sufficient electrical insulating property and stability of such a film, attempts have been made to reform the HfO film into a densified and stable film by subjecting the HfO film to a fast annealing treatment at about 650° C. to 800° C. under an $O_2$ or $N_2$ atmosphere, thereby removing impurities such as C, H and the like from the film. Such densification is performed to shorten the average interatomic distance in an amorphous state, although it does not lead to crystallization. Such a fast annealing treatment heats the entire substrate to a predetermined temperature to reform the HfO film.

In recent years, semiconductor devices may have a shallow junction structure with miniaturization and require a low thermal budget (thermal history). Accordingly, the annealing treatment used in the above-described high-k forming process requires removal of impurities from the film at a low temperature for film densification in order to provide a low thermal budget. The reason for the low temperature annealing treatment is as follows. Generally, in a process of manufacturing a device, if the device is treated in a later step at a temperature higher than that used in an earlier step, the device already built up in the earlier step may collapse or a film thereof may change in its characteristics. Therefore, the device cannot be treated in the later step at a temperature exceeding that used in the earlier step. Accordingly, there is a demand for a technique which can perform a film reforming process for improved device performance at a low temperature.

Japanese Patent Application Laid-Open Publication No. 2004-296820 discloses a technique in which, in a film depositing process, a hafnium-containing thin film is formed on a substrate, and, in a film reforming process, argon radicals are supplied onto the substrate so as to remove impurity elements contained in the thin film formed in the film depositing process.

SUMMARY

The present disclosure provides some embodiments of a substrate processing apparatus which is capable of overcoming the above problems and reforming a dielectric formed on a substrate surface while restricting a thermal budget by suppressing an increase in a substrate temperature.

The present disclosure suggests a technique for heating and reforming a dielectric formed on a substrate supported on a conductive substrate cooling unit with a gap therebetween using a microwave, and cooling the substrate to restrict a thermal budget of the substrate.

According to one embodiment of the present disclosure, there is provided a substrate processing apparatus including: a processing chamber configured to process a substrate having a front surface including a dielectric; a substrate support member provided within the processing chamber to support the substrate; a microwave supplying unit configured to supply a microwave to a front surface side of the substrate supported on the substrate support member; and a conductive substrate cooling unit which is provided at a rear surface side of the substrate supported on the substrate support member and has an opposing surface facing the rear surface of the substrate, wherein a distance between the top of the substrate support member and the opposing surface of the substrate cooling unit corresponds to an odd multiple of ¼ wavelength of the microwave supplied when the substrate is processed.

According to another embodiment of the present disclosure, there is provided a method of manufacturing a semiconductor device using a substrate processing apparatus including a processing chamber configured to process a substrate, a substrate support member provided within the processing chamber to support the substrate, a microwave supplying unit configured to supply a microwave to a front surface side of the substrate supported on the substrate support member, and a conductive substrate cooling unit which is provided at a rear surface side of the substrate supported on the substrate support member and has an opposing surface facing the rear surface of the substrate, wherein a distance between the top of the substrate support member and the opposing surface of the substrate cooling unit corresponds to an odd multiple of ¼ wavelength of the supplied microwave, the method comprising: loading the substrate having a front surface including a dielectric into the processing chamber and supporting the substrate on the substrate support member; supplying the microwave to the front surface side of the substrate supported on the substrate support member; cooling the substrate from the rear surface side of the substrate supported on the substrate support member while the microwave is being supplied; and after supplying the microwave, stopping supplying the microwave and unloading the substrate out of the processing chamber.

DETAILED DESCRIPTION

First Embodiment

Figure 1:
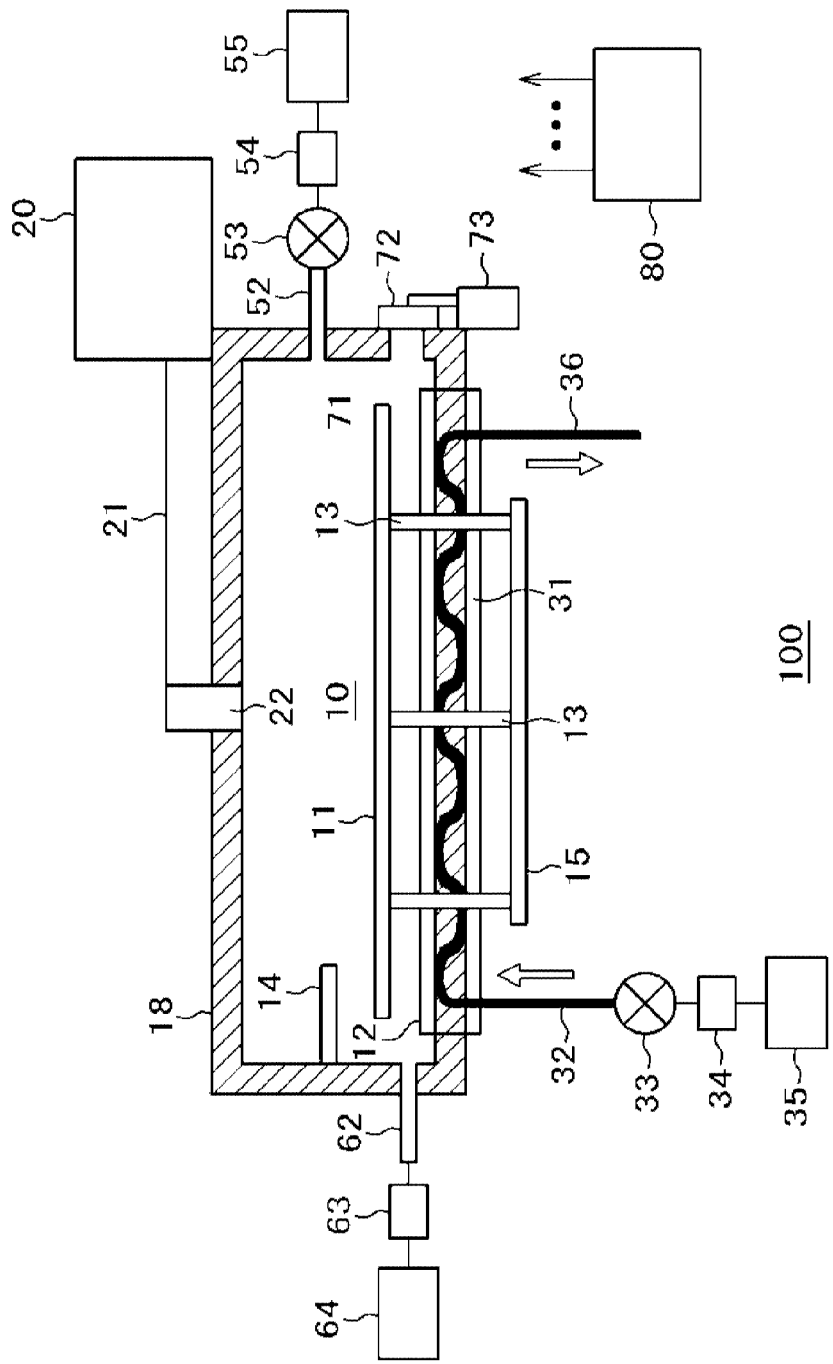
FIG. 1 is a vertical sectional view of a substrate processing apparatus according to a first embodiment of the present disclosure.

Configuration of a substrate processing apparatus according to a first embodiment of the present disclosure will now be described with reference to FIG. 1. FIG. 1 is a vertical sectional view of the substrate processing apparatus according to the first embodiment of the present disclosure. The substrate processing apparatus 100 includes a processing chamber 10, a transfer chamber (not shown) and a microwave supplying unit. The processing chamber 10 processes a wafer 11 as a semiconductor substrate. The microwave supplying unit includes a microwave generator 20, a waveguide 21 and a waveguide opening 22.

The microwave generator 20 generates a microwave such as a fixed frequency microwave or a variable frequency microwave. An example of the microwave generator 20 may include a microtron or the like. The microwave generated in the microwave generator 20 is introduced into the processing chamber 10 from the waveguide opening 22 communicating with the processing chamber 10 via the waveguide 21.

The microwave introduced into the processing chamber 10 repeatedly reflects against the walls of the processing chamber 10. The microwave reflects in different directions within the processing chamber 10. Thus, the processing chamber 10 is filled with the microwave. The microwave irradiated onto the wafer 11 within the processing chamber 10 is absorbed by the wafer 11 which is then dielectrically heated by the microwave.

Figure 3:
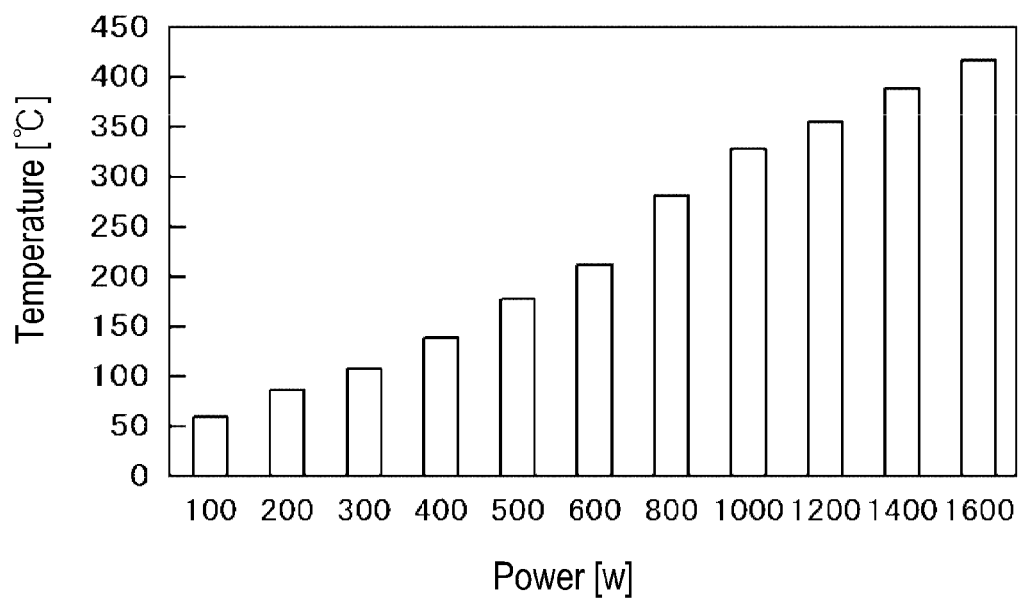
FIG. 3 is a diagram showing one example of a relationship between microwave power and substrate temperature.

The temperature of the wafer 11 is proportional to the power of the microwave. FIG. 3 shows one example of a relationship between microwave power and wafer temperature when a silicon wafer is irradiated with a microwave. As shown in FIG. 3, higher microwave power provides a higher wafer temperature.

The wafer temperature also depends on the size and shape of the processing chamber, position of the waveguide opening of the microwave, and position of the wafer. Wafer temperature values shown herein are only examples. However, the relationship of higher microwave power providing a higher wafer temperature is kept unchanged.

A processing vessel 18 forming the processing chamber 10 is made of metal such as aluminum (Al), stainless steel (SUS) or the like, and has a structure to shield the processing chamber 20 from the external environment.

Within the processing chamber 10 are provided substrate support pins 13 which are substrate support members for supporting the wafer 11. The substrate support pins 13 are provided in such a manner that the center of the supported wafer 11 substantially coincides with the center of the processing chamber 10 in a vertical direction. The substrate support pins 13 configured to support the wafer 11 are made of a material such as quartz, Teflon® or the like, and the number thereof is plural (three in this embodiment).

If the substrate support pins 13 are made of a material having a low heat transfer property, such as quartz, it is possible to prevent heat of the wafer 11 from being transferred to a substrate supporting table 12 which will be described later. As used herein, the term "low heat transfer property" refers to, at least, a heat transfer property lower than that of the substrate supporting table 12. This allows the wafer 11 to be uniformly heated. For example, if the substrate supporting table 12 is made of a material having a high heat transfer property, such as metal, heat relief due to thermal conduction from the wafer 11 to the substrate support pins 13 is increased, which results in a localized distribution of low temperature in the wafer 11. This makes it difficult to heat the surface of the wafer 11 uniformly.

In addition, the substrate support pins 13 are supported on a pedestal 15. The pedestal 15 may be vertically driven to move the substrate support pins 13 vertically.

The substrate supporting table 12 acting as a substrate cooling unit and having a conductive property is provided below the wafer 11. The substrate supporting table 12 is made of a conductive metal material such as aluminum (Al) or the like. The substrate supporting table 12 is a disc-like or cylindrical plate whose outer diameter is larger than that of the wafer 11. In this manner, the substrate supporting table 12 is provided below and in parallel to the rear surface of the wafer 11 supported by the substrate support pins 13. The substrate supporting table 12 has an opposing surface facing the rear surface of the wafer 11.

Since the substrate supporting table 12 is made of a conductive metal, an electric potential of the microwave in the substrate supporting table 12 becomes zero. Accordingly, if the wafer 11 is directly placed on the substrate supporting table 12, an intensity of an electric field of the microwave becomes weak. Accordingly, in this embodiment, the wafer 11 is placed at a position of ¼ wavelength ($\lambda/4$) or an odd multiple of $\lambda/4$ of the microwave from the opposing surface of the substrate supporting table 12. As used herein, the phrase "the opposing surface of the substrate supporting table 12" refers to the surface of the substrate supporting table 12 that faces the rear surface of the wafer. Since an electric field is strong at the position of an odd multiple of $\lambda/4$, the wafer 11 can be efficiently heated with the microwave. In this embodiment, since the microwave has a fixed frequency of, for example, 5.8 GHz, and a wavelength of, for example, 51.7 mm, the distance from the opposing surface of the substrate supporting table 12 to the rear surface of the wafer 11 is set to be 12.9 mm. In other words, a control unit 80, which will be described later, controls the substrate support pins 13 to be vertically moved such that the distance between the top of the substrate support members and the opposing surface of the substrate cooling unit corresponds to a ¼ wavelength of the microwave when the substrate is processed.

This configuration allows the wafer 11 to be placed at a peak position (or convex position) of the microwave, thereby providing high heating efficiency of the wafer 11. It is expected that the high heating efficiency allows other films to be heated due to thermal conduction from a dielectric film of the wafer 11. However, as will be described later, by placing a metal substrate supporting table 12 including a cooling unit and having an area equal to or larger than the size of the wafer 11 at a position facing the rear surface of the wafer 11, heat can be drawn away from the entire rear surface of the wafer 11. As a result, the wafer 11 can be uniformly cooled to prevent films other than the dielectric film on the wafer 11 from being heated.

A frequency of the microwave may be changed (varied) with time. In that case, the distance from the surface of the substrate supporting table 12 to the wafer 11 may be calculated from a wavelength of a representative frequency in a varying frequency band. For example, for a varying frequency band of 5.8 GHz to 7.0 GHz, the center frequency thereof may be set as a representative frequency and the distance from the opposing surface of the substrate supporting table 12 to the rear surface of the wafer 11 may be set to be 11.5 mm for a wavelength of 46 mm of the representative frequency of 6.4 GHz.

Further, a plurality of power supplies having different fixed frequencies may be provided to supply different microwaves having different frequencies.

The substrate supporting table 12 provides a coolant passage 31 through which a coolant for cooling the wafer 11 can flow. In this embodiment, water is used as the coolant. In other embodiments, other coolant such as cooling chiller and the like may be used as the coolant. The coolant passage 31 is connected to a coolant supply pipe 32 for supplying the coolant into the coolant passage 31 and a coolant discharge pipe 36 for discharging the coolant out of the coolant passage 31 to the outside of the processing chamber 10. The coolant supply pipe 32 is connected to a gate valve 33 for opening/closing the coolant supply pipe 32, a flow rate controller 34 for controlling a coolant flow rate and a coolant source 35 in this order from a downstream. The gate valve 33 and the flow rate controller 34 are electrically connected to and controlled by the control unit 80.

A temperature detector 14 for detecting the temperature of the wafer 11 is provided above the wafer 11 within the processing chamber 10. An example of the temperature detector 14 may include an infrared sensor. The temperature detector 14 is electrically connected to the control unit 80. If the wafer 11 temperature detected by the temperature detector 14 is higher than a predetermined temperature, the control unit 80 controls the gate valve 33 and the flow rate controller 34 to regulate a flow rate of coolant flowing through the coolant passage 31 so that the temperature of the wafer 11 can be decreased to the predetermined temperature.

A gas inlet 52 for introducing a gas such as nitrogen ($N_2$) or the like is provided at an upper wall of the processing chamber 10 in the upper part of the processing vessel 18. The gas inlet 52 is connected to a gas source 55, a flow rate controller 54 for regulating a gas flow rate, and a valve 53 for opening/closing a gas passage in this order from an upstream. By opening/closing the valve 53, gas is introduced or shut off from the gas inlet 52 into the processing chamber 10. The gas introduced from the gas inlet 52 is used to cool the wafer 11 or is used as purge gas to push gas within the processing chamber 10 out of the processing chamber 10.

A gas supply unit is constituted by the gas source 55, the gas inlet 52, the flow rate controller 54 and the valve 53. The flow rate controller 54 and the valve 53 are electrically connected to and controlled by the control unit 80.

As shown in FIG. 1, a gas outlet 62 for exhausting gas within the processing chamber 10 is provided at a side wall of the processing chamber 10 in the lower part of the rectangular processing vessel 18. The gas outlet 62 is connected to a pressure regulating valve 63 and a vacuum pump 64, which is an exhauster, in this order from an upstream. The internal pressure of the processing chamber 10 is adjusted to a predetermined value by regulating the degree of an opening of the pressure regulating valve 63.

A gas exhaust unit is constituted by the gas outlet 62, the pressure regulating valve 63 and the vacuum pump 64. The pressure regulating valve 63 and the vacuum pump 64 are electrically connected to and controlled by the control unit 80.

As shown in FIG. 1, a wafer transfer opening 71 for transferring the wafer 11 into/out of the processing chamber 10 is provided at one side of the processing vessel 18. The wafer transfer opening 71 is provided with a gate valve 72. When the gate valve 72 is opened by a gate valve driver 73, the processing chamber 10 communicates with a transfer chamber via the wafer transfer opening 71.

A transfer robot (not shown) for transferring the wafer 11 is provided within the transfer chamber. The transfer robot has a transfer arm for supporting the wafer 11 while the wafer 11 is being transferred. By opening the gate valve 72, the transfer robot can transfer the wafer 11 between the processing chamber 10 and the transfer chamber.

The substrate processing apparatus 100 includes the control unit 80 for controlling operation of various components of the substrate processing apparatus 100, such as the microwave generator 20, the gate valve driver 73, the transfer robot, the pedestal 15, the flow rate controllers 54 and 34, the valves 53 and 33, the pressure regulating valve 63 and so on.

Next, a substrate processing operation according to this embodiment in the substrate processing apparatus 100 will be described. The substrate processing operation according to this embodiment is one of a plurality of processes for manufacturing a semiconductor device. The substrate processing operation is controlled by the control unit 80.

(Substrate Loading Process)

In a substrate loading process of loading the wafer 11 into the processing chamber 10, the gate valve 72 is first opened so that the processing chamber 10 communicates with the transfer chamber. Next, the height of the substrate support pins 13 is adjusted so that the distance from the substrate supporting table 12 to the wafer 11 corresponds to an odd multiple of $\lambda/4$ of a supplied microwave. Next, the wafer 11 to be processed is transferred from the transfer chamber into the processing chamber 10 by the transfer robot. The wafer 11 transferred into the processing chamber 10 is placed on top of the substrate support pins 13 by the transfer robot and supported by the substrate support pins 13. Next, when the transfer robot returns from the processing chamber 10 to the transfer chamber, the gate valve 72 is closed.

(Nitrogen Gas Replacing Process)

Next, the atmosphere within the processing chamber 10 is replaced with a nitrogen ($N_2$) atmosphere. Since an air atmosphere outside the processing chamber 10 is dragged into the processing chamber 10 (when the wafer 11 is transferred into the processing chamber 11), the $N_2$ replacement within the processing chamber 10 is performed to prevent water or oxygen in the air atmosphere from affecting the process. $N_2$ gas is introduced from the gas inlet 52 into the processing chamber 10 while discharging gas (atmosphere) within the processing chamber 10 from the gas outlet 62 by the vacuum pump 64. At this time, the internal pressure of the processing chamber 10 is adjusted to a predetermined pressure (the air pressure in this embodiment) by the pressure regulating valve 63. The predetermined pressure is preferably higher than a pressure at which no plasma is generated. For example, the predetermined pressure may be higher than 200 Torr.

(Heating Process)

Next, a microwave generated in the microwave generator 20 is introduced into the processing chamber 10 via the waveguide opening 22 and the wafer 11 is irradiated with the microwave on its front surface side. Such microwave irradiation heats a high-k film on the front surface of the wafer 11 to 100 to 600° C. to reform the high-k film, i.e., remove impurities such as C, H and so on from the high-k film, to achieve a densified and stable insulating thin film.

A dielectric such as a high-k film or the like has microwave absorptivity varying depending on its dielectric constant. A higher dielectric constant provides higher microwave absorptivity. Our studies showed that irradiation of a wafer with a high power microwave heats and reforms a dielectric film on a wafer. In addition, we have found that heating by a microwave is characterized by dielectric heating depending on permittivity $\in$ and dielectric tangent tan $\delta$ and, when materials having such different physical properties are simultaneously heated, only a material which is more likely to be heated, that is, a material having higher permittivity, is selectively heated.

As for annealing of the high-k film, the high-k film has higher permittivity $\in$ than that of silicon which is a material of a wafer substrate. For example, permittivity $\in$ of silicon is 9.6, while permittivities $\in$ of HfO and ZrO films are 25 and 35, respectively. Accordingly, when a wafer with the high-k film formed thereon is irradiated with the microwave, only the high-k film can be selectively heated.

Our studies showed that higher power microwave irradiation provides a greater film reforming effect. The higher power microwave irradiation may also result in a faster increase in the temperature of the high-k film.

In comparison, if a relatively low power microwave is irradiated for a long time, the temperature of the entire wafer is increased during the reforming process. This is because the temperature of the silicon also increases due to dielectric heating of silicon itself by the microwave and thermal conduction from the high-k film on the front surface of the wafer irradiated with the microwave to the silicon in the rear surface of the wafer.

It is considered that the reason for the great film reforming effect by the high power microwave irradiation is that the dielectric can be heated by dielectric heating to a high temperature until the temperature of the entire wafer reaches its upper limit of temperature.

Accordingly, in this embodiment, the wafer 11 is prevented from being increased in temperature by supplying a coolant into the coolant passage 31 during the microwave irradiation. Preferably, the gate valve 33 and the flow rate controller 34 are controlled to regulate a flow rate of the coolant flowing into the coolant passage 31 such that the temperature of the wafer 11 reaches the predetermined temperature. In this manner, by keeping the processing temperature of the wafer 11 constant, it is possible to improve the reproducibility of a process result in processing a plurality of wafers.

In addition, in the heating process, the control unit 80 opens the valve 53 to introduce the $N_2$ gas from the gas inlet 52 into the processing chamber 10, while adjusting the internal pressure of the processing chamber 10 to a predetermined value (the air pressure in this embodiment) by the pressure regulating valve 63 to exhaust the $N_2$ gas within the processing chamber 10 from the gas outlet 62. Thus, in the heating process, the internal pressure of the processing chamber 10 is kept at the predetermined pressure value. In this example, the heating process was performed for 5 minutes under the conditions where power of a microwave having a frequency of 5.8 to 7.0 GHz is 1600 W and the internal pressure of the processing chamber 10 is the air pressure. In addition, the wafer 11 may be further cooled by controlling the flow rate of $N_2$ gas introduced into the processing chamber 10.

When the cooling effect of the $N_2$ gas is in active use, the cooling effect by the gas can be further improved by providing the gas inlet 52 in the substrate supporting table 12 and flowing the gas between the wafer 11 and the substrate supporting table 12. The temperature of the wafer 11 may be also controlled by controlling the flow rate of gas.

In addition, although the $N_2$ gas is used in this embodiment, other gas having a large heat transfer coefficient, such as diluted He gas or the like, may be added to the $N_2$ gas for further improvement of the substrate cooling effect as long as there is no problem in the process and stability.

After performing the substrate heating process for a predetermined period of time with the introduction of the microwave as described above, the introduction of the microwave is stopped.

In addition, although in this embodiment the wafer 11 is heated without being horizontally rotated, the wafer 11 may be heated while being rotated.

(Cooling Process)

When the heating process is completed, the substrate support pins 13 are descended and the wafer 11 is kept for a predetermined period of time at a position at which the distance between the wafer 11 and the substrate supporting table 12 is shorter than the distance during the heating process. In this case, the distance between the wafer 11 and the substrate supporting table 12 is set to, for example, 0.1 mm to 0.5 mm. This allows the heated wafer 11 to be cooled more rapidly. As time is taken for the substrate temperature to decrease when the heated wafer moves under the air pressure, a throughput may be more or less likely to be lowered. Therefore, by rapidly cooling the wafer to reduce the time taken to decrease the temperature of the wafer, it is possible to raise the throughput even while the wafer is moving under the air pressure.

In addition, such rapid cooling allows a film on the heated wafer 11 to be rapidly stabilized. In particular, this can rapidly stabilize a crystal structure of a high-k film. After completing the heating process, if the wafer is directly transferred into the atmospheric transfer chamber without performing the cooling process, it is feared that impurities may be mixed into the film.

In addition, by cooling the wafer within the processing chamber 10, there is no need to use high heat-resistant material for the transfer robot in the atmospheric transfer chamber.

(Substrate Unloading Process)

After the cooling process is completed, the heated wafer 11 is unloaded from the processing chamber 10 into the transfer chamber in the opposite order to the order shown in the above-described substrate loading process. At this time, when the transfer robot takes out the wafer 11 on the substrate support pins 13, it is preferable that the height of the substrate support pins 13 is so adjusted that the distance from the substrate supporting table 12 to the wafer 11 corresponds to a distance during the heating process. In this way, it is possible to omit a process of adjusting the distance from the substrate supporting table 12 to the wafer 11 after loading the next wafer 11.

The above-described first embodiment may provide at least the following effects (1) to (8).

(1) It is possible to reform a dielectric on the substrate surface while suppressing a thermal budget of the substrate.

(2) It is possible to selectively heat a material having a high permittivity.

(3) It is possible to efficiently heat a dielectric on the substrate surface since an electric field of a microwave at a substrate height position can be strengthened.

(4) It is possible to prevent heat from escaping from the substrate support pins and hence uniformly heat the substrate since the substrate support pins are made of material having a low heat transfer property.

(5) It is possible to control a degree of substrate cooling depending on a process.

(6) It is possible to improve the reproducibility of a process result in processing a plurality of wafers by keeping the substrate processing temperature constant.

(7) It is possible to rapidly stabilize a film on the substrate by descending the substrate support pins and rapidly cooling the substrate after the heating process.

In particular, it is possible to rapidly stabilize a crystal structure of a high-k film.

(8) It is possible to omit a process of adjusting the height in the heating process since the substrate in the substrate loading/unloading process has the same height position as in the heating process.

Second Embodiment

Figure 2:
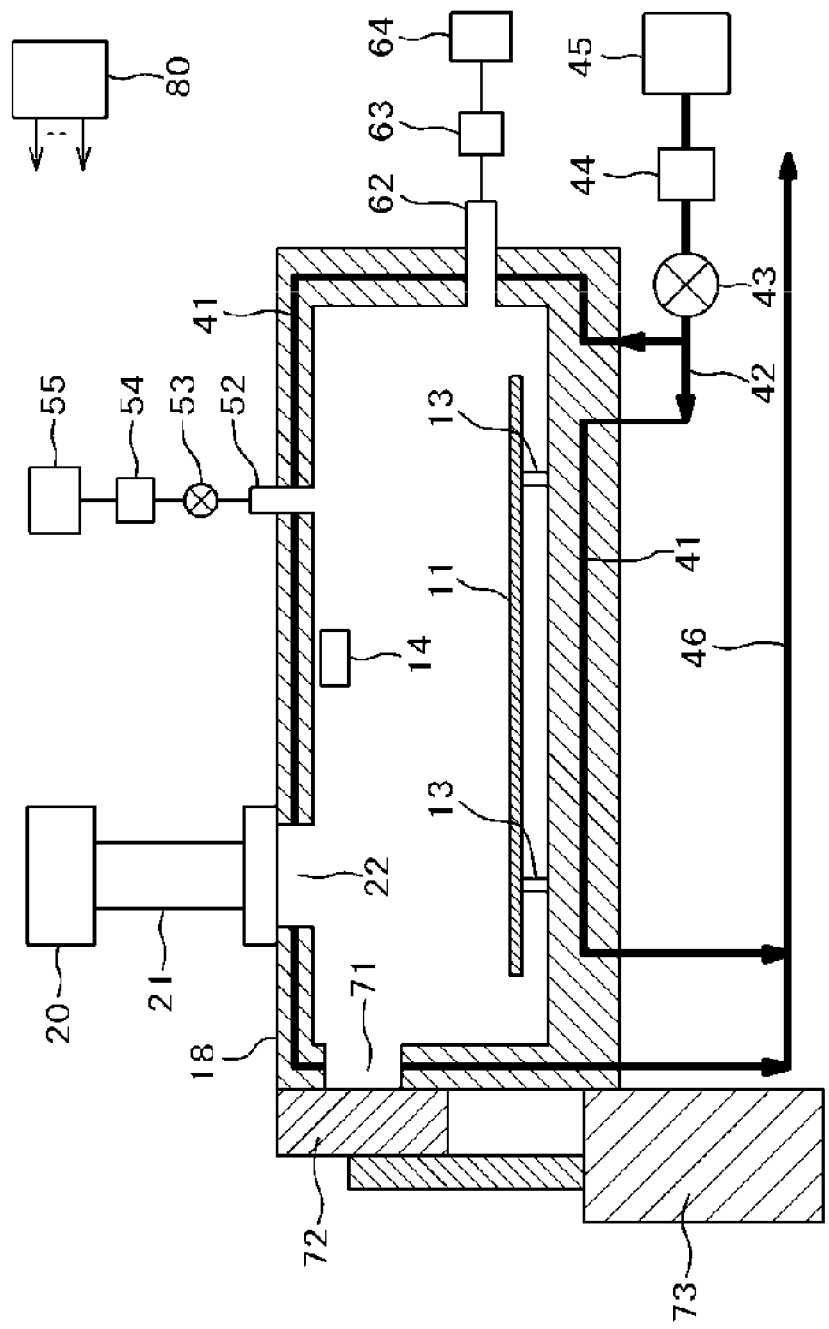
FIG. 2 is a vertical sectional view of a substrate processing apparatus according to a second embodiment of the present disclosure.

Configuration of a substrate processing apparatus according to a second embodiment of the present disclosure will now be described with reference to FIG. 2. FIG. 2 is a vertical sectional view of the substrate processing apparatus according to the second embodiment of the present disclosure. In the second embodiment, instead of the substrate supporting table 12 in the first embodiment, a coolant passage 41 provided in the bottom wall of the processing vessel 18 is used as a substrate cooling unit. Other configurations except configuration related to the coolant passage 41 and a substrate processing operation including a heating process are the same as those in the first embodiment, and therefore, explanation of which will not be repeated for the purpose of brevity. In addition, although not shown, the second embodiment has the same pedestal 15 as in the first embodiment, and therefore, explanation of which will not be repeated for the purpose of brevity.

As shown in FIG. 2, the coolant passage 41 for cooling the wall of the processing vessel 18 is provided inside the wall. The coolant passage 41 is connected to a coolant supply pipe 42 for supplying a coolant into the coolant passage 41 and a coolant discharging pipe 46 for discharging the coolant from the coolant passage 41 outside the processing chamber 10. The coolant supply pipe 42 is connected to a gate valve 43 for opening/closing the coolant supply pipe 42, a flow rate controller 44 for controlling a coolant flow rate and a coolant source 45 in this order from a downstream. The gate valve 43 and the flow rate controller 44 are electrically connected to and controlled by the control unit 80. In this embodiment, the coolant is supplied into the coolant passage 41, and in the heating process, a wafer 11 heated by microwave irradiation can be cooled from the rear surface side of the wafer 11 by the coolant passage 41 provided in the bottom wall. In this way, the size of the processing vessel 18 may be reduced since there is no need to use the substrate supporting table 12 in the first embodiment.

In addition, when a cooling effect of a gas is in active use, the cooling effect by the gas can be further improved by providing the gas inlet 52 in the bottom wall of the processing chamber 10 and flowing the gas between the wafer and the bottom of the processing chamber. This provides a structure simpler than that of the first embodiment.

In addition, the coolant passage 41 as a wall cooling unit provided inside a side wall and a top wall can prevent a temperature increase of the side wall and the top wall due to the microwave irradiation and radiant heat from the wafer 11 or heated gas. Thus, this can prevent reflection efficiency of the microwave at each wall from being lowered with an increase in temperature. By keeping the temperature of each wall constant, it is possible to keep the reflection efficiency of the microwave at each wall constant and further to stabilize substantial microwave power. Accordingly, when a plurality of substrates are processed in one batch, reproducibility of a process in the batch and among batches can be improved since processing conditions in the batch and among batches are fixed.

In addition to the above-described effects of the first embodiment, the second embodiment may provide at least the following effects (1) to (2).

(1) It is possible to construct a substrate cooling unit with the bottom wall of the processing chamber.

(2) It is possible to further improve reproducibility of a process result since the temperature of the side wall and/or top wall of the processing chamber can be kept under fixed conditions, thereby further preventing variation of a process among substrates or among batches.

The present disclosure is not limited to the above embodiments but it should be understood that the present disclosure may be modified in various ways without departing from the spirit and scope of the present disclosure.

In the first embodiment, the coolant passage 41 for cooling each wall, which is used in the second embodiment, may be provided in addition to the substrate supporting table 12. In addition, although in the first embodiment, the substrate support pins 13 are controlled to be vertically moved by the control unit such that the distance between the top of the substrate support member and the opposing surface of the substrate cooling unit during the substrate processing corresponds to an odd multiple of ¼ wavelength of the supplied microwave, the position of the substrate support pins 13 may be fixed and the distance between the top of the substrate support member and the opposing surface of the substrate cooling unit during the substrate processing may be set to an odd multiple of ¼ wavelength of the supplied microwave. However, in this case, cooling efficiency may be lowered since the substrate cannot approach the substrate supporting table 12 during the cooling process.

In addition, although in the heating process and cooling process of the first embodiment the substrate support pins 13 are controlled to be vertically moved by the control unit so as to adjust the distance between the top of the substrate support member and the opposing surface of the substrate cooling unit, the substrate supporting table 12 may be controlled to be vertically moved, instead of moving the substrate support pins 13 vertically.

Further, although in the disclosed embodiments an object to be processed is a wafer, the object may be a photo mask, a printed circuit board, a liquid crystal panel, a compact disk, a magnetic disk or the like.

Additionally, the present disclosure may encompass at least the following aspects.

A first aspect of the present disclosure may provide a substrate processing apparatus including: a processing chamber configured to process a substrate having a front surface including a dielectric; a substrate support member provided within the processing chamber to support the substrate; a microwave supplying unit configured to supply a microwave to a front surface side of the substrate supported on the substrate support member; and a conductive substrate cooling unit which is provided at a rear surface side of the substrate supported on the substrate support member and has an opposing surface facing the rear surface of the substrate, wherein a distance between the top of the substrate support member and the opposing surface of the substrate cooling unit corresponds to an odd multiple of ¼ wavelength of the microwave supplied when the substrate is processed.

With the above configuration of the substrate processing apparatus, a dielectric on the front surface of the substrate can be efficiently heated since an electric field of the microwave at a height position of the substrate is strengthened. In addition, the substrate can be uniformly heated since the substrate cooling unit can draw away heat of the substrate from the entire rear surface of the substrate. As a result, portions other than the dielectric on the front surface of the substrate can be prevented from being heated.

A second aspect of the present disclosure may provide a substrate processing apparatus according to the first aspect, wherein the substrate support member is made of material having a heat transfer property lower than that of the substrate cooling unit.

With the above configuration of the substrate processing apparatus, since the substrate support member is made of a material having low transfer property such as quartz or the like, it is possible to prevent heat of the substrate from escaping to the substrate support member. As a result, it is possible to heat the substrate uniformly.

A third aspect of the present disclosure may provide a substrate processing apparatus according to the first or second aspect, wherein the substrate support member comprises substrate support pins for supporting the substrate on the top of the substrate support member.

With the above configuration of the substrate processing apparatus, the substrate cooling unit can be more easily configured.

A fourth aspect of the present disclosure may provide a substrate processing apparatus according to the first or third aspect, wherein the substrate cooling unit is provided in the bottom wall of the processing chamber.

With the above configuration of the substrate processing apparatus, the substrate cooling unit can be configured by the bottom wall of the processing chamber. Further, with this configuration, the substrate cooling unit can be more easily configured.

A fifth aspect of the present disclosure may provide a substrate processing apparatus according to the first or fourth aspect, further including a wall cooling unit which cools one or both of the side wall and/or the top wall of the processing chamber.

With the above configuration of the substrate processing apparatus, since the temperature of one or more of the side walls and/or top wall of the processing chamber can be kept under fixed conditions, variation of the process among substrates or among batches can be further prevented.

A sixth aspect of the present disclosure may provide a substrate processing apparatus according to the first or fifth aspect, wherein the substrate is made of a plurality of material having different permittivities.

With the above configuration of the substrate processing apparatus, it is possible to selectively heat material having high permittivity.

A seventh aspect of the present disclosure may provide a substrate processing apparatus according to the first or sixth aspect, further including: a gas supply unit configured to supply gas into the processing chamber; a gas exhaust unit configured to exhaust gas out of the processing chamber; and a control unit configured to control the gas supply unit and the gas exhaust unit such that the internal pressure of the processing chamber is kept higher than 200 Torr.

With the above configuration of the substrate processing apparatus, since the gas promotes substrate cooling, a higher cooling effect can be achieved. In addition, the substrate can be efficiently heated under a pressure at which no plasma is generated, without being damaged due to plasma.

An eighth aspect of the present disclosure may provide a substrate processing apparatus according to the first or seventh aspect, further including a coolant flow rate controller for controlling a flow rate of coolant flowing into the substrate cooling unit which is connected to the substrate cooling unit.

With the above configuration of the substrate processing apparatus, a degree of cooling of the substrate can be controlled depending on a process.

A ninth aspect of the present disclosure may provide a substrate processing apparatus according to the eighth aspect, further including a temperature detector for detecting the temperature of the substrate supported on the substrate support member, wherein the coolant flow rate controller is controlled based on temperature data detected by the temperature detector.

With the above configuration of the substrate processing apparatus, since the coolant flow rate can be controlled based on the substrate temperature, the substrate temperature can be more finely controlled, which may result in a high quality substrate.

A tenth aspect of the present disclosure may provide a method of manufacturing a semiconductor device using a substrate processing apparatus including a processing chamber configured to process a substrate, a substrate support member provided within the processing chamber to support the substrate, a microwave supplying unit configured to supply a microwave to a front surface side of the substrate supported on the substrate support member, and a conductive substrate cooling unit which is provided at a rear surface side of the substrate supported on the substrate support member and has an opposing surface facing the rear surface of the substrate, wherein a distance between the top of the substrate support member and the opposing surface of the substrate cooling unit corresponds to an odd multiple of ¼ wavelength of the supplied microwave, the method including: loading the substrate having a front surface including a dielectric into the processing chamber and supporting the substrate on the substrate support member; supplying the microwave to the front surface side of the substrate supported on the substrate support member; cooling the substrate from the rear surface side of the substrate supported on the substrate support member while the microwave is being supplied; and after supplying the microwave, stopping supplying the microwave and unloading the substrate out of the processing chamber.

An eleventh aspect of the present disclosure may provide a method of manufacturing a semiconductor device using a substrate processing apparatus including a processing chamber configured to process a substrate, a substrate support member provided within the processing chamber to support the substrate, a microwave supplying unit configured to supply a microwave to a front surface side of the substrate supported on the substrate support member, and a conductive substrate cooling unit which is provided at a rear surface side of the substrate supported on the substrate support member and has an opposing surface facing the rear surface of the substrate, the method including: loading the substrate having a front surface including a dielectric into the processing chamber and supporting the substrate on the substrate support member; setting a distance between the top of the substrate support member and the opposing surface of the substrate cooler to correspond to an odd multiple of ¼ wavelength of the supplied microwave; supplying the microwave to the front surface side of the substrate supported on the substrate support member under the state where the distance between the top of the substrate support member and the opposing surface of the substrate cooling unit is set to correspond to an odd multiple of ¼ wavelength of the supplied microwave; cooling the substrate from the rear surface side of the substrate supported on the substrate support member while the microwave is being supplied; and after supplying the microwave, stopping supplying the microwave and unloading the substrate out of the processing chamber.

The substrate processing apparatus and the semiconductor device manufacturing method as configured above has the effect of reforming the dielectric on the front surface of the substrate while restricting a thermal budget of the substrate by suppressing an increase in the substrate temperature.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a processing chamber configured to process a substrate having a front surface including a dielectric;
   a substrate support member provided within the processing chamber to support the substrate;
   a microwave supplying unit configured to supply a microwave to a front surface side of the substrate supported on the substrate support member;
   a conductive substrate cooling unit which is provided below a rear surface side of the substrate supported on the substrate support member and has an opposing surface facing the rear surface of the substrate; and
   a control unit configured to control the substrate support member such that a distance between a top of the substrate support member and the opposing surface of the substrate cooling unit corresponds to an odd multiple of ¼ wavelength of the microwave supplied when the substrate is processed, wherein the control unit is further configured to control, after processing the substrate, the substrate support member such that the distance between the top of the substrate support member and the opposing surface of the substrate cooling unit is shorter than the distance during processing the substrate.

2. The substrate processing apparatus of claim 1, wherein the substrate is made of a plurality of films having different permittivities.

3. The substrate processing apparatus of claim 1, wherein the substrate support member is made of material having a heat transfer property lower than that of the substrate cooling unit.

4. The substrate processing apparatus of claim 1, wherein the substrate support member comprises substrate support pins for supporting the substrate on the top of the substrate support members.

5. The substrate processing apparatus of claim 1, wherein the conductive substrate cooling unit is provided in a bottom wall of the processing chamber.

6. The substrate processing apparatus of claim 1, further comprising a wall cooling unit configured to cool at least one of a side wall and a top wall of the processing chamber.

7. The substrate processing apparatus of claim 1, further comprising:
   a gas supply unit configured to supply gas into the processing chamber; and
   a gas exhaust unit configured to exhaust gas out of the processing chamber,
   wherein the control unit is further configured to control the gas supply unit and the gas exhaust unit such that the internal pressure of the processing chamber is kept higher than 200 Torr.

8. The substrate processing apparatus of claim 1, further comprising a coolant flow rate controller for controlling a flow rate of a coolant flowing into the conductive substrate cooling unit, wherein the coolant flow rate controller is connected to the substrate cooling unit.

9. The substrate processing apparatus of claim 8, further comprising a temperature detector for detecting the temperature of the substrate supported on the substrate support member, wherein the coolant flow rate controller is controlled based on temperature data detected by the temperature detector.

10. The substrate processing apparatus of claim 1, further comprising a wall cooling unit configured to cool a wall of the processing chamber.

11. A method of manufacturing a semiconductor device using a substrate processing apparatus including a processing chamber configured to process a substrate, a substrate support member provided within the processing chamber to support the substrate, a microwave supplying unit configured to supply a microwave to a front surface side of the substrate supported on the substrate support member, and a conductive substrate cooling unit which is provided below a rear surface side of the substrate supported on the substrate support member and has an opposing surface facing the rear surface of the substrate, the method comprising:
   loading the substrate having a front surface including a dielectric into the processing chamber and supporting the substrate on the substrate support member;
   controlling the substrate support member such that a distance between a top of the substrate support member and the opposing surface of the substrate cooling unit corresponds to an odd multiple of ¼ wavelength of the supplied microwave;
   supplying the microwave to the front surface side of the substrate supported on the substrate support member;
   cooling the substrate from the rear surface side of the substrate supported on the substrate support member while the microwave is being supplied;
   after supplying the microwave, stopping supplying the microwave and controlling the substrate support member such that the distance between the top of the substrate support member and the opposing surface of the substrate cooling unit is shorter than the distance during supplying the microwave to cool the substrate; and
   unloading the substrate out of the processing chamber.

12. A method of manufacturing a semiconductor device using a substrate processing apparatus including a processing chamber configured to process a substrate, a substrate support member provided within the processing chamber to support the substrate, a microwave supplying unit configured to supply a microwave to a front surface side of the substrate supported on the substrate support member, and a conductive substrate cooling unit which is provided below a rear surface side of the substrate supported on the substrate support member and has an opposing surface facing the rear surface of the substrate, the method comprising:
   loading the substrate having a front surface including a dielectric into the processing chamber and supporting the substrate on the substrate support member;
   setting a distance between the top of the substrate support member and the opposing surface of the substrate cooling unit to correspond to an odd multiple of ¼ wavelength of the supplied microwave;

supplying the microwave to the front surface side of the substrate supported on the substrate support member under the state where the distance between the top of the substrate support member and the opposing surface of the substrate cooling unit is set to correspond to an odd multiple of ¼ wavelength of the supplied microwave;

cooling the substrate from the rear surface side of the substrate supported on the substrate support member while the microwave is being supplied;

after supplying the microwave, stopping supplying the microwave and controlling the substrate support member such that the distance between the top of the substrate support member and the opposing surface of the substrate cooling unit is shorter than the distance during supplying the microwave to cool the substrate; and unloading the substrate out of the processing chamber.

\* \* \* \* \*